United States Patent [19]

Araki et al.

[11] Patent Number: 4,751,496
[45] Date of Patent: Jun. 14, 1988

[54] WIDE DYNAMIC RANGE ANALOG TO DIGITAL CONVERSION METHOD AND SYSTEM

[75] Inventors: Tetsuro Araki, Hachioji; Mitsumasa Kubo, Iruma, both of Japan

[73] Assignee: Teac Corporation, Tokyo, Japan

[21] Appl. No.: 881,389

[22] Filed: Jul. 2, 1986

[30] Foreign Application Priority Data

Jul. 11, 1985 [JP] Japan ................................ 60-152772

[51] Int. Cl.⁴ ............................................. H03M 1/20
[52] U.S. Cl. ............................................. 340/347 AD
[58] Field of Search ................ 340/347 AD, 347 CC; 375/34

[56] References Cited

U.S. PATENT DOCUMENTS 4,550,309 10/1985 Hiller ........................... 340/347 AD

FOREIGN PATENT DOCUMENTS 50-68258 6/1975 Japan .

OTHER PUBLICATIONS

Lowe, "Electronics", Sep. 11, 1980, pp. 171-172.
"The Application of Large Amplitude Dither to the Quantization of Wide Range Audio Signals", Yoshio Yamasaki, *The Journal of the Acoustical Society of Japan*, vol. 39, No. 7, 1983.

Primary Examiner—Charles D. Miller
Attorney, Agent, or Firm—Woodcock Washburn Kurtz Mackiewicz & Norris

[57] ABSTRACT

A method and apparatus well suited for digitizing an audio signal with as wide a dynamic range as possible. An analog dither signal is added to an analog audio or like data signal to provide an analog data/dither signal. This analog data/dither signal and the analog dither signal are both converted into a digital data/dither signal and a digital dither signal respectively, and the digital dither signal is subsequently subtracted from the digital data/dither signal to obtain a digital data signal equivalent to the analog data signal. The magnitude of the incoming analog data signal may be so high that when the analog dither signal is added thereto, the magnitude of the resulting data/dither signal may exceed the capacity of the analog to digital converter in use. In that case the analog dither signal is either gated off or reduced in magnitude, with the result that the analog to digital converter inputs either the data signal only or the data/dither signal having a magnitude not exceeding its capacity.

20 Claims, 6 Drawing Sheets

WIDE DYNAMIC RANGE ANALOG TO DIGITAL CONVERSION METHOD AND SYSTEM

BACKGROUND OF THE INVENTION

Our invention relates to the conversion of electric signals from analog to digital form. More specifically, our invention pertains to a method of, and a system for, digitizing an audio or like data signal, with the addition of analog dither (an artificially created white noise signal) to the analog data signal and the subsequent removal of the dither from the digitized data signal, with a view to the reduction of noise and distortion. Still more specifically, our invention concerns improvements in such a method and system whereby the analog dither to be added to the data signal is suppressed or reduced in level, as required, for the analog to digital conversion of the data signal with a greater dynamic range than heretofore under the same hardware limitations.

The pulse code modulation (PCM) or digital processing of audio signals has become, or is becoming, the mainstream of high fidelity sound recording and reproduction with the advent and ever increasing commercial acceptance of compact discs (CDs). However, some problems remain unsolved, or not perfectly solved, in the art of digital sound processing. One of these is the "quantization noise", that is, the differences between the samples of the music wave and the quantized values of the samples. The quantization noise becomes particularly pronounced, distorting the reproduced sound as higher harmonics, when the input signal level is low and there are a relatively small number of quantization steps. Even when the input signal level is high, the quantization noise will distort the signal if it changes slowly.

We are aware of a conventional solution to this quantization noise problem. The solution involves the use of dither for turning the quantization noise into white noise which hardly affects the appreciation of the reproduced sound. An analog dither signal is superposed on the audio signal prior to its analog to digital conversion and, following the conversion, is removed from the digitized audio signal. This technique is discussed extensively in the article entitled "The Application of Large Amplitude Dither to the Quantization of Wide Range Audio Signals" by Yoshio Yamasaki in *The Journal of the Acoustical Society of Japan*, Vol. 39, No. 7, published 1983. Japanese Laid Open Patent Application No. 50-68258 also discloses the same technique.

We have found that this known solution has a weakness. As dither is added to the analog audio or other data signal, the total magnitude of the resulting data and dither signal may exceed the capacity (maximum allowable input voltage) of the analog to digital (A/D) converter used for the conversion of the data and dither signal, particularly when the data signal level is high. There might be contemplated the use of an A/D converter of sufficiently large capacity to accept the expected maximum magnitude of the combined data and dither signal. Such hardware is very expensive and so impractical.

SUMMARY OF THE INVENTION

We have hereby discovered how to assure an optimum dynamic range in the analog to digital conversion of audio or other data signals with the introduction and later removal of dither to and from such signals, with the use of an A/D converter of minimal capacity.

According to our invention, stated in brief, the magnitude of an analog dither signal to be added to an analog data signal to be digitized is limited, as required, in order that the magnitude of the resulting analog data and dither signal may fall within the capacity of an A/D converter used for the conversion of at least the data and dither signal from analog to digital form.

In the practice of our invention, the varying magnitude of the incoming analog data signal is discriminated from the analog data signal itself or from its combination with the analog dither signal. Whenever the analog data signal magnitude is found too high, the analog dither signal to be, or being, added thereto, is either gated off or reduced in magnitude to such an extent that the magnitude of the resulting combination of data and dither does not exceed the capacity of the A/D converter. It is therefore possible to employ a smaller capacity A/D converter than heretofore for the conversion of the full amplitude of the data signal.

The above and other features and advantages of our invention and the manner of realizing them will become more apparent, and the invention itself will best be understood, from a study of the following description and appended claims, with reference had to the attached drawings showing some preferably embodiments of our invention.

BRIEF DESCRIPTION OF THE DRAWINGS

FIG. 7 is a block diagram of a modification of a dither generating circuit used in the systems of FIGS. 5 and 6.

DETAILED DESCRIPTION OF THE INVENTION

Figure 1:
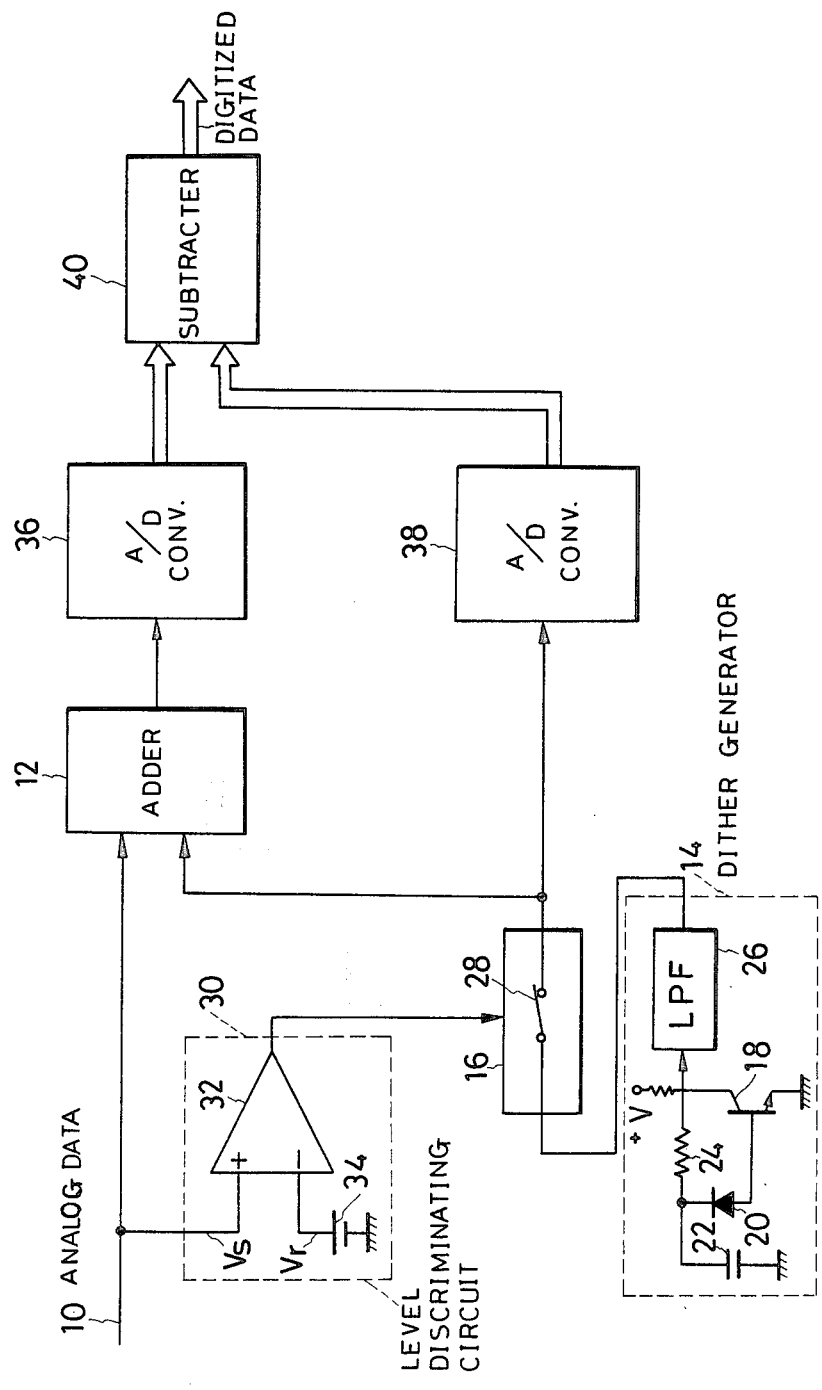
FIG. 1 is a block diagram of the analog to digital conversion system embodying the principles of our invention.

We will now describe our invention in terms of a first preferable embodiment thereof illustrated in FIG. 1. We have shown in this figure the analog to digital conversion system of our invention as adapted for translating an analog audio signal, ranging in frequency from zero up to approximately 20 kHz, into a 16 bits digital signal. The representative system has an input line 10 for receiving the analog data signal to be digitized. We are using the term "data signal" to mean any such signal that can be processed in accordance with our invention. The input line 10 is connected to one of the two inputs of an analog adder 12. To the other input of this adder 12 is connected an analog dither generator 14 via a gate circuit 16.

We have illustrated in FIG. 1 a typical configuration of the analog dither generator 14. It includes a transistor 18 having a collector connected to a positive power supply +V, and an emitter grounded. The base of this transistor 18 is connected to the anode of a noise generating Zener diode 20. The cathode of the Zener diode 20 is grounded via a capacitor 22 on one hand and, on the other hand, connected to the collector of the transistor 18 via a resistor 24. Also included is an active low pass filter (LPF) 26 having its connected to the collector of the transistor 18 and its output to the gate circuit 16.

Such being the configuration of the analog dither generator 14, the transistor 18 functions to amplify the noize current generated during the nonconduction of the Zener diode 20. The output from the LPF 26, or from the dither generator 14, is a relatively low level white noize or dither signal containing various frequency components from zero to 300 kHz.

Interposed between dither generator 14 and adder 12, the gate circuit 16 makes on/off control of the passage of the analog dither signal therethrough depending upon the magnitude of the incoming analog data signal to be digitized. The gate circuit 16 takes the form of a simple analog switch 28, normally closed as shown, in this particular embodiment.

We have employed a level discriminating circuit 30 for the on/off control of the switch 28 of the gate circuit 16. The level discriminating circuit 30 functions to prevent the passage of the analog dither signal through the gate circuit 16 when the voltage of the incoming analog data signal exceeds a predetermined limit. Included in this circuit 30 is a voltage comparator 32 having a noninverting input connected to the input line 10, and an inverting input connected to a reference voltage source 34. Thus the voltage comparator 32 compares the voltage Vs of the incoming analog data signal against the reference voltage Vr from the source 34. The output from the voltage comparator 32, and therefore from the level discriminating circuit 30, goes high when the data signal voltage Vs exceeds the reference voltage Vr. The high output from the level discriminating circuit 30 causes nonconducution through the gate circuit 16 by opening its normally closed switch 28. We will later discuss the magnitude of the reference voltage Vr in more detail.

Connected to the input line 10 and gate circuit 16 as aforesaid, the adder 12 adds the analog data signal and the analog dither signal, provided, of course, that the incoming data signal voltage Vs is not more than the reference voltage Vr. We will refer to the addition of the data and dither signals as the data/dither. It should be noted, however, that the output from the adder 12 may consist of either the data/dither signal or the data signal only.

The adder 12 has its output connected to a first D/A converter 36 for converting the analog data/dither signal (or data signal only) from the adder 12 into a 16 bits digital signal. The reference voltage Vr of the level discriminating circuit 30 is determined in relation to the capacity or maximum allowable input voltage of the first D/A converter 36. The reference voltage Vr must be not more than the difference between the capacity of the first D/A converter 36 and the voltage of the dither signal from the dither generator 14. Preferably, and as in this embodiment, the reference voltage Vr may be equal to the difference between the converter capacity and the dither signal voltage.

At 38 is shown a second D/A converter having its input connected directly to the gate circuit 16. The second D/A converter 38 translates the analog dither signal that has been allowed to pass through the gate circuit 16, into an equivalent digital dither or white noise signal.

The two D/A converters 36 and 38 are connected respectively to the two inputs of a digital subtracter 40. This subtracter subtracts the digital dither signal from the digital data/dither signal and puts out a digital data signal as a replica of the analog data signal that has been input to this A/D conversion system.

Operation

The input line 10 inputs the analog data signal whereas the dither generator 14 puts out the analog dither signal at a voltage lower than that of the incoming data signal. The level discriminating circuit 30 constantly compares the voltage Vs of the incoming analog data signal with the reference voltage Vr. As long as the data signal voltage Vs does not exceed the reference voltage Vr, the output from the level discriminating circuit 30 remains low, holding the gate circuit 16 conductive. Thus the adder 12 inputs both the data and the dither signals, putting out an analog data/dither signal for delivery to the first A/D converter 36. The voltage of this data/dither signal is now not more than the maximum allowable input level of the first A/D converter 36, so that the latter will operate within its capacity for digitizing the data/dither signal.

The analog dither signal that has passed the gate circuit 16 is also delivered to the second A/D converter 38, thereby to be translated into a digital dither signal. The subtractor 40 inputs both the digital data/dither signal from the first A/D converter 36 and the digital dither signal from the second A/D converter 38. The subtraction of the digital dither signal from the digital data/dither signal provides the desired digital data signal practically free from any dither component.

The voltage Vs of the incoming analog data signal may exceed the reference voltage Vr. Then the output from the level discriminating circuit 30 will go high to cause nonconduction through the gate circuit 16. As the output from the dither generator 14 is thus gated off, the adder 12 will input, and output, only the data signal. The first A/D converter 36 will digitize this data signal only. As the dither input to the second A/D converter 38 is then also gated off, the subtracter 40 will pass the incoming digital data signal as such.

Usually, the dither signal is gated off for such a short period of time, and the quantization noise is so small when the data voltage is high, that any adverse effect accruing from the digital to analog conversion of the data without use of dither is negligible. Such an adverse effect, if any, is more than amply offset by the advantage of the greater dynamic range offered in accordance with our invention. As the dither signal is gated off as above, the first A/D converter 36 can use its full capacity for processing of the data signal, so that a wider dynamic range is gained with use of a D/A converter of the same capacity as heretofore.

Second Form

Figure 2:
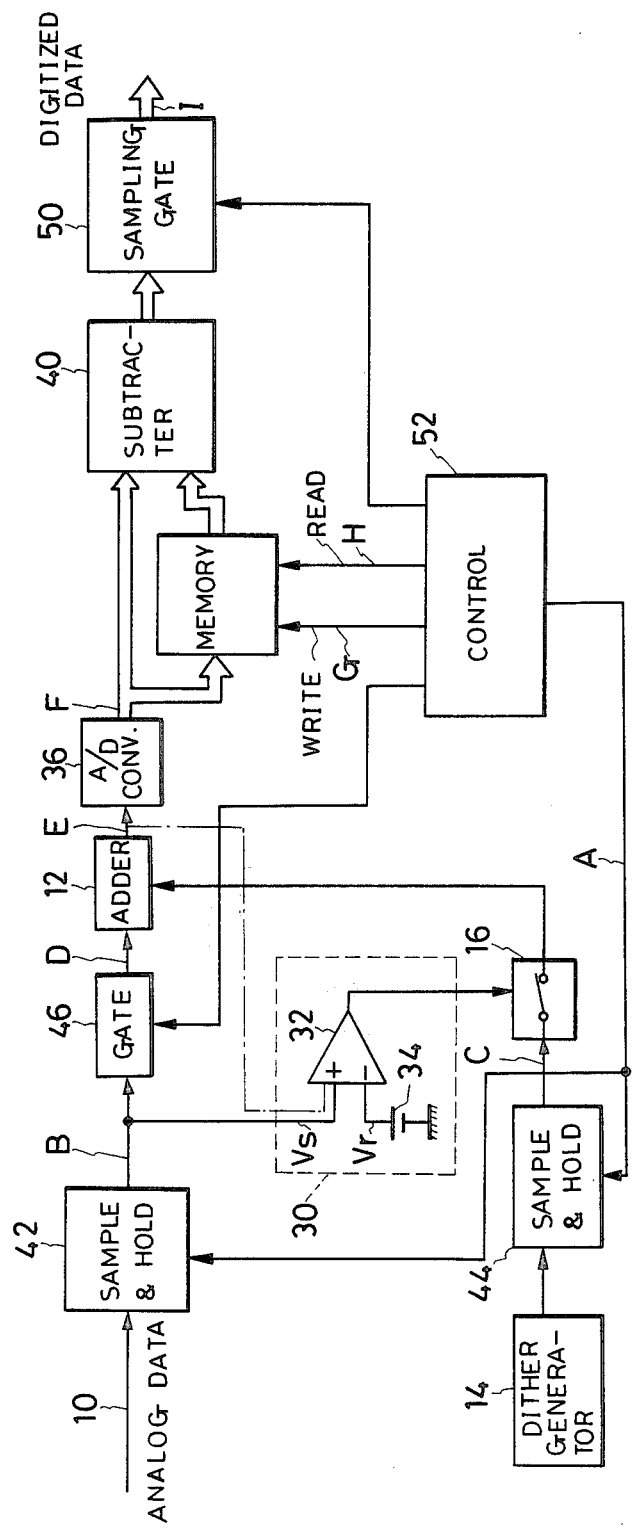
FIG. 2 is a block diagram of another preferred form of the analog to digital conversion system in accordance with our invention.

We have illustrated in FIG. 2 another preferred embodiment which in fact is an adaptation of our invention for the analog to digital conversion system described and claimed in Araki et al. copending U.S. patent application Ser. No. 810,973 filed Dec. 19, 1985, under the title of "Analog to Digital Conversion Method and System with the Introduction and Later Removal of Dither".

This second system also comprises the analog data input circuit 10, adder 12, dither generator 14, gate circuit 16, level discriminating circuit 30, A/D converter 36, and subtracter 40, all connected substantially as in the FIG. 1 embodiment. The second A/D converter 38 of the preceding embodiment is absent. The signal D/A converter 32 employed in this second system processes both of the data/dither signal and the dither signal by time division multiplexing.

For such time division multiplexing, we have employed in this embodiment first and second sample and hold circuit 42 and 44, a gate circuit 46, memory 48, sampling gate circuit 50, and control circuit 52. The first sample and hold circuit 42 has its input connected to the analog data input line 10, and its output to the gate circuit 46 and thence to the adder 12. Connected to the output of the adder 12, the A/D converter 36 has its output connected directly to the subtracter 40 on one hand and, on the other hand, to the memory 48 and thence to the subtracter. The output of the subtracter 40 is connected to the sampling gate circuit 50. The second sample and hold circuit 44 is connected between dither generator 14 and gate circuit 16. We will call this second sample and hold circuit 44 the dither sample and hold circuit by way of contradistinction from the first sample and hold circuit 42, to which we will then refer as the data sample and hold circuit. The control circuit 52 controls the operations of the data sample and hold circuits 42, dither sample and hold circuit 44, gate circuit 46, memory 48, and sampling gate circuit 50 in prescribed time relationship to one another.

As in the preceding embodiment, this alternative system employs the level discriminating circuit 30 for controlling the gate circuit 16. However, the level discriminating circuit 30 is connected to the output of the first sample and hold circuit 42, instead of to the input line 10.

Operation of the Second Form

Figure 3:
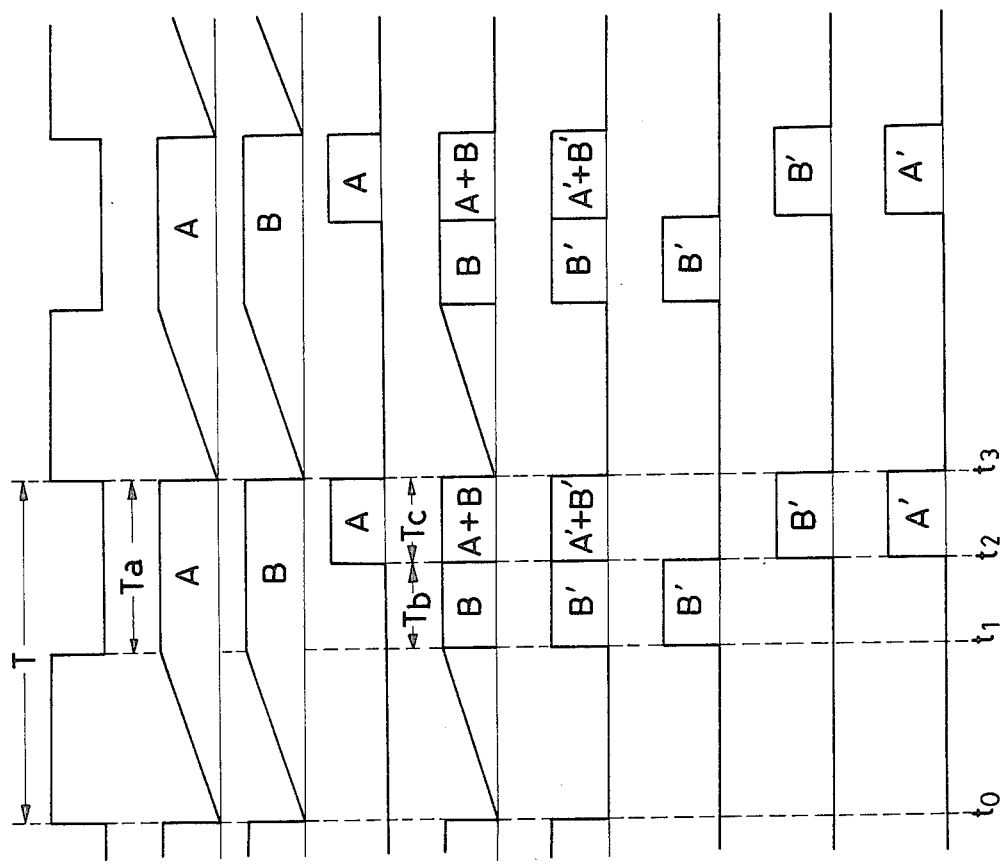
FIG. 3 is a timing diagram showing in proper time relationship the signals appearing in various parts of the FIG. 2 system in order to explain its operation.

In the course of the following operational description of the FIG. 2 system, we will refer also to FIG. 3 which shows at (A) through (I) the signals useful in explaining the operation. In FIG. 2 we have indicated by the same capitals A through I the parts where the correspondingly designated signals of FIG. 3 appear, for the easier understanding of the operation. We have plotted the signals of FIG. 3 on the assumption that the magnitude of the incoming analog data signal is not more than the predetermined limit, with the gate circuit 16 held conductive to permit the delivery of the analog dither signal from generator 14 to adder 12.

At (A) in FIG. 3 is shown a series of sampling pulses fed from control circuit 52 to the first and second sample and hold circuits 42 and 44, with each sampling pulse lasting as from moment t0 to moment t1. We will refer to the period from moment t1 to moment t3, when the next sampling pulse appears, as one cycle T of the sampling pulses, and to the period from moment t1 to moment t3 as an interval Ta between the sampling pulses. In response to these sampling pulses, the data sample and hold circuit 42 and dither sample and hold circuit 44 produce the data output A and dither output B as indicated at (B) and (C) in FIG. 3. Both circuits 42 and 44 hold the data and dither samples during the intervals Ta between the sampling pulses.

Receiving the data output from the data sample and hold circuit 42, the gate circuit 36 puts out the data signal A during a second half Tc, as from moment t2 to moment t3, of each sampling interval Ta, as at (D) in FIG. 3, under the control of the control circuit 52.

The adder circuit 12 inputs the gate circuit output of FIG. 3(D) and the dither sample and hold circuit output of FIG. 3(C), it being understood that the magnitude of the data signal is now not more than the predetermined limit. The resulting output from the adder circuit 12 is therefore as plotted at (E) in FIG. 3. It will be seen that the adder circuit output is a time division multiplexing of the dither signal B, during a first half Tb (as from moment t1 to moment t2) of each sampling interval Ta, and the data/dither signal A+B during the second half Tc of each sampling interval, together with the unstable component appearing as from moment t0 to moment t1.

The time multiplexed dither signal B and data/dither signal A+B is delivered to the A/D converter 36, thereby to be transformed from analog to digital form. Therefore, as represented at (F) in FIG. 3, the output from the A/D converter 36 is a time division multiplexing of the digital dither signal B' and digital data/dither signal A'+B'. This multiplex digital output is delivered to the subtracter 40, both directly and via the memory 48.

The memory 48 inputs from the control circuit 52 a write command during the first half Tb of each sampling interval Ta to store the digital dither signal B' contained in the multiplex output from the A/D converter 36, as at (G) in FIG. 3. The stored dither signal B' is read out from the memory 48 during the second half Tc of each sampling interval, as at (H) in FIG. 3, under the control of the control circuit 52. Consequently, the digital dither signal B' from the memory 48 has now been synchronized with the digital data/dither signal A'+B' contained in the multiplex output of FIG. 3(F) from the A/D converter 36.

The subtracter circuit 40 inputs the FIG. 3(F) output from the A/D converter 36 and the FIG. 3(H) output from the memory 36. Since the digital dither signal B' from the memory 48 has been synchronized with the digital data/dither signal A'+B' of the multiplex output from the A/D converter 36, the subtracter circuit 40 puts out only the digital data signal A' during the second half Tc of each sampling interval Ta. However, the output from the subtracter circuit 40 contains other undesired signal components during the other other period of each sampling cycle T. We have therefore employed in this alternative embodiment the sampling gate circuit 50 for the removal of such undesired signal components. Responding to sampling pulses supplied from the control circuit 52, the sampling gate circuit 50 extracts only the desired digital data signal A' during the second half Tc of each sampling interval Ta, as represented at (I) in FIG. 3.

Thus, in this alternative embodiment, the analog data/dither signal A+B and analog dither signal B are time multiplexed and digitized by the same A/D converter 36. Further the subtracter circuit 40 removes the digital dither signal B' from the digital data/dither signal A'+B' by utilizing the digital dither signal that has been extracted from the multiplex output from the A/D converter 36 by the memory 48. Since the two inputs to the subtracter circuit 40 have been derived from the same output from the A/D converter 36 and so posses the same conversion errors, the dither component is thoroughly removable from the data/dither signal for the provision of the noiseless digital data output.

As has been explained in connection with the FIG. 1 embodiment, the level discriminating circuit 30 functions to cause nonconduction through the gate circuit 16 when the voltage Va of the incoming analog data signal exceeds the reference voltage Vr. Thus blocked by the gate circuit 16, the analog dither signal is then not added to the analog data signal. Only the data signal is then supplied to the D/A converter 36.

Third Form

Figure 4:
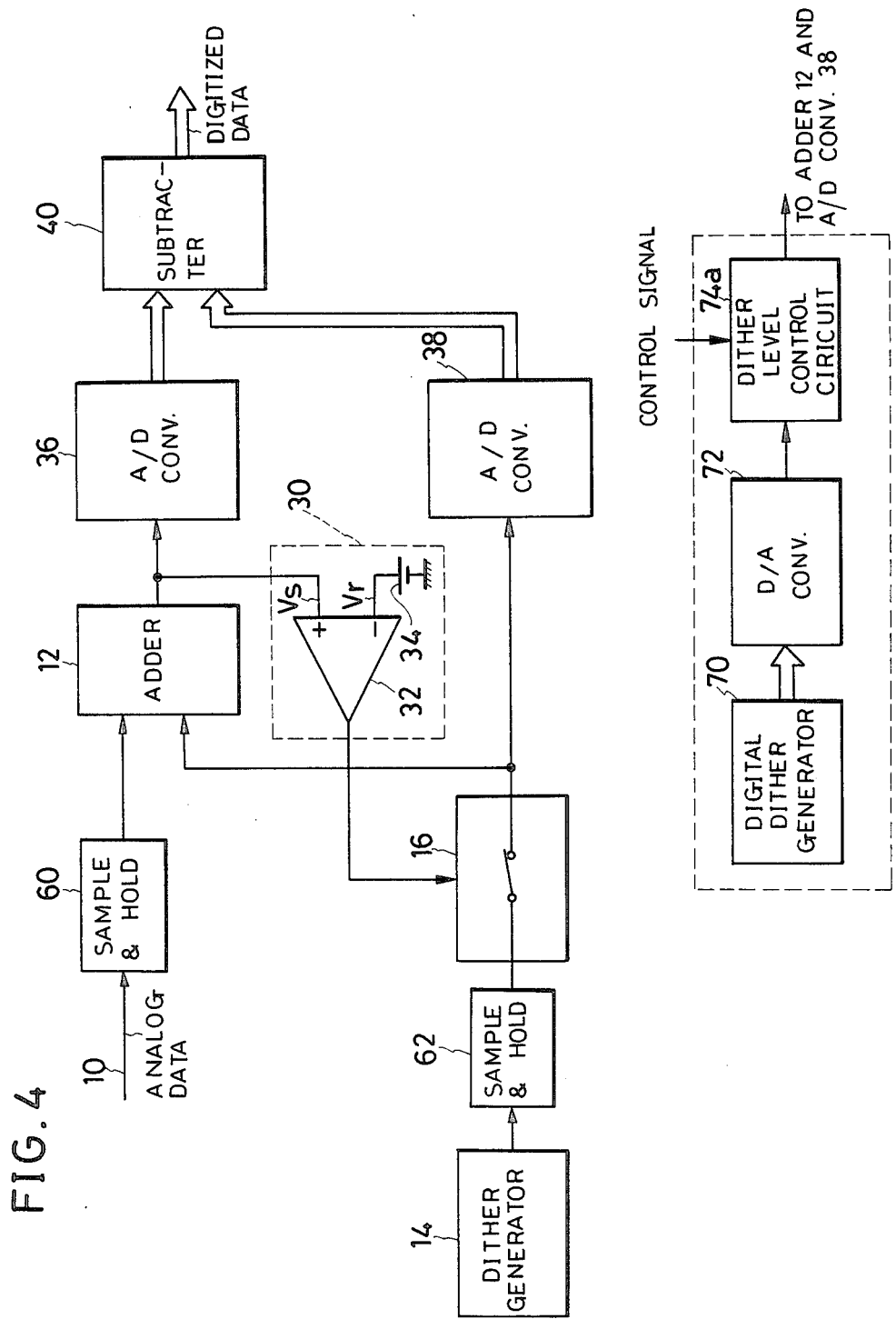
FIG. 4 is a block diagram of still another preferred form of the analog to digital conversion system in accordance with our invention.

In the FIGS. 1 and 2 systems we gated the digital dither signal by discriminating the magnitude of the incoming analog data signal. In FIG. 4, then, the FIG. 1 system is shown modified for gating the analog dither signal on or off depending upon the total magnitude of the analog data/dither signal, that is, upon the magnitude of the output from the adder 12.

For detecting the total magnitude of the analog data/dither signal, the level discriminating circuit 30 is connected to the output of the adder 12. The voltage comparator 32 included in the level discriminating circuit 30 compares the voltage Vs of the data/dither signal from the adder 12 with the reference voltage Vr from its source 34. The reference voltage Vr is not more than, preferably equal to, the maximum allowable input voltage of the first A/D converter 36. If the reference voltage Vr is set equal to the maximum allowable input voltage of the first A/D converter 36, the output from the voltage comparator 32 will go high when the voltage Vs of the data/dither signal from the adder 12 exceeds the capacity of the first A/D converter. The high output from the level discriminating circuit 30 will cause nonconduction through the gate circuit 16, preventing the delivery of the analog dither signal from the generator 14 to the adder 12, as well as to the second A/D converter 38. Then the first A/D converter 36 will be required to handle only the data signal within its capacity.

The FIG. 4 system further includes a sample and hold circuit 60 connected between input line 10 and adder 12 for sampling the incoming analog data signal at a prescribed sampling rate. Another sample and hold circuit 62 is connected between dither generator 14 and gate circuit 16 for sampling the analog dither signal at the same rate as the first recited sample and hold circuit 60.

There is a time lag from the moment the magnitude of the data/dither signal first exceeds the predetermined limit to the moment the gate circuit 16 blocks the dither signal. However, this time lag is too short to present any serious problem. It is easy, moreover, to extract from the output from the adder 12 only those portions of the data signal which are within the capacity of the first A/D converter 36.

The other constructional and operational details of this FIG. 4 system are as previously described in connection with the FIG. 1 embodiment.

Fourth Form

Figure 5:
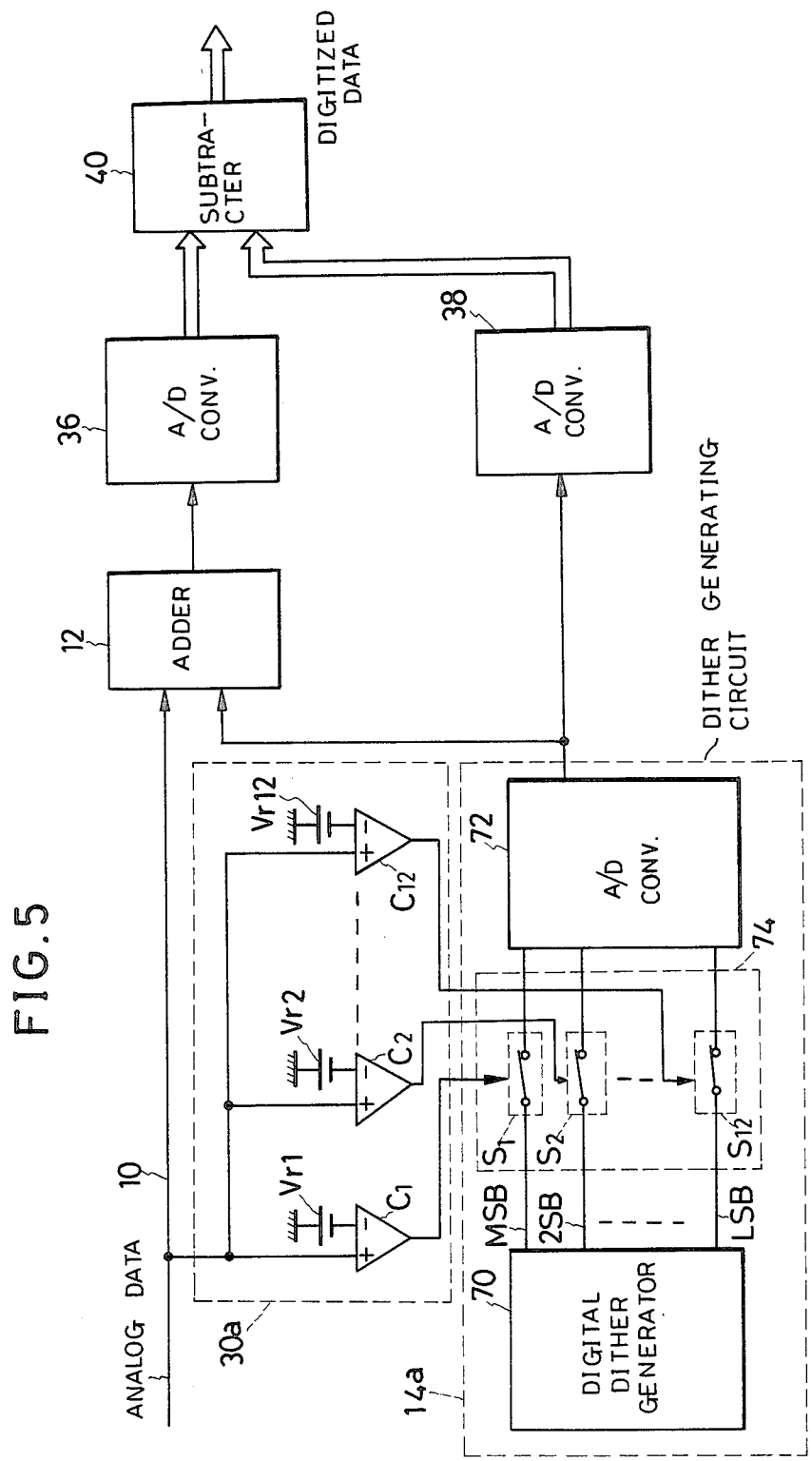
FIG. 5 is a block diagram of yet another preferred form of the analog to digital conversion system in accordance with our invention.

FIG. 5 shows a further preferred form of the A/D conversion system of our invention. This system may be thought of as a modification of the FIG. 1 system in that the two A/D converters 36 and 38 are employed for separately processing the data/dither signal and the dither signal. The gate circuit 16 is absent from this system; instead, we employ a dither generating circuit 14a which is itself capable of providing a dither signal having a magnitude controlled in accordance with the magnitude of the incoming analog data signal to be digitized. In a sense, therefore, the dither generating circuit 14a performs functions analogous with, but not exactly equivalent to, those of the combination of the dither generator 14 and gate circuit 16 of the foregoing embodiments.

The dither generating circuit 64 comprises a digital dither generator 70, a D/A converter 72, and a dither level control circuit 74 interposed therebetween. The digital dither generator 70 can take the form of a conventional maximal length pulse sequence pseudorandom pulse generator, putting out a 12 bits digital dither signal composed of successive sets of practically random pulses. The dither level control circuit 74 comprises 12 normally closed switches S1 through S12 connected respectively to the 12 lines through which the 12 bits of the digital ditgher signal are transferred from dither generator 70 to D/A converter 72. The switch S1 is connected to the line MSB through which is transmitted the most significant bit of the digital dither signal; the switch S2 to the line 2SM through which is transmitted the second significant bit of the digital dither signal; and the switch S12 to the line LSM through which is transmitted the least significant bit of the digital dither signal.

For the on/off control of the 12 switches S1 through S12 of the dither level control circuit 74, we provide a level discriminating circuit 30a comprised of 12 voltage comparators C1 through C12. All these voltage comparators have a first input connected to the analog data input line 10. The second inputs of the voltage comparators C1 through C12 are connected to different sources of reference voltages Vr1 through Vr12, respectively. The outputs of the voltage comparators C1 through C12 are connected to actuate the switches S1 through S12, respectively, of the dither level control circuit 74.

The 12 reference voltages Vr1 through Vr12 are determined as follows:

$$Vr1 = Vm - Vd,$$
$$Vr2 = Vm - Vd/2,$$
$$Vr3 = Vm - Vd/4,$$
$$Vr4 = Vm - Vd/8,$$

$$\cdot$$
$$\cdot$$

$$Vr12 = Vm - Vd/2048$$

wherein

Vm=the maximum allowable input voltage of the first A/D converter 12, and

Vd=the voltage of the analog dither signal from the D/A converter 72.

This FIG. 5 system is identical in the other details of construction with that of FIG. 1.

Operation of the Fourth Form

Let it be supposed that the incoming analog data signal has a voltage Vs lower than the lowest, Vr1, of the 12 reference voltages Vr1 through Vr12 of the level discriminating circuit 30a. Then the outputs from all the comparators C1 through C12 of the level discriminating circuit 30a are low, holding all the switches S1 through S12 of the dither level control circuit 74 closed. Accordingly, the 12 bits of the digital dither signal from the generator will all be fed to the D/A converter 72, thereby to be translated into an analog dither signal for delivery to the adder 12 and second D/A converter 38. Even if this analog dither signal is of the maximum magnitude, the resulting analog data/dither signal put out by the adder 12 will have a voltage less than the maximum allowable input voltage Vm of the first A/D converter 36.

When the voltage Vs of the incoming analog data signal is more than the lowest reference voltage Vr1 but less than the second lowest reference voltage Vr2, the output from only the first comparator C1 of the level discriminating circuit 30a will go high. This high output will open the associated switch S1 on the most significant bit line MSB. All but the most significant one of the 12 bits of the digital dither signal will be delivered to the D/A converter 72, which will then produce an analog dither signal of correspondingly reduced magnitude. The resulting analog data/dither signal put out by the adder 12 will have a voltage less than the maximum allowable input voltage Vm of the first A/D converter 36.

When the voltage Vs of the incoming analog data signal exceeds the highest reference voltage Vr12, the outputs from all the comparators C1 through C12 will go high, opening all the switches S1 through S12 of the dither level control circuit 74. Then the dither is entirely cut off and is not added to the data signal.

The definite advantage gained by this embodiment is that dither is added to the analog data signal as long as the magnitude of the latter is less than the highest reference voltage Vr12. We have defined Vr12 as (Vm−Vd/2048). Of course, the greater the data magnitude, the less is the magnitude of the dither added thereto. The addition of such reduced magnitude dither is nonetheless preferable to the gating off of the dither.

Fifth Form

Figure 6:
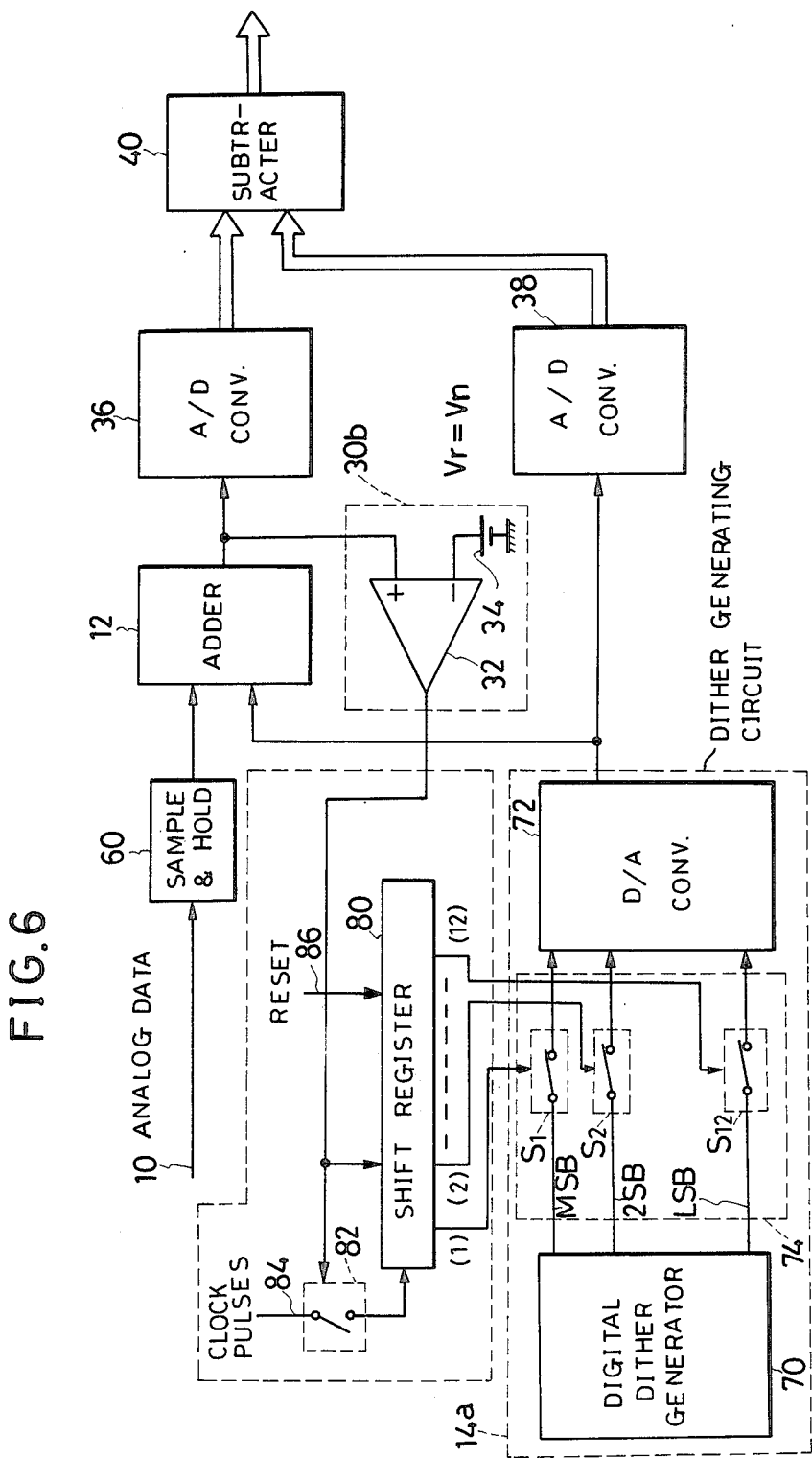
FIG. 6 is a block diagram of a further preferred form of the analog to digital conversion system in accordance with our invention.

FIG. 6 shows a further embodiment of our invention which employs the dither generating circuit 14a of exactly the same configuration as that of FIG. 5. In this embodiment, however, the magnitude of the dither is controlled not in accordance with the magnitude of the incoming analog data signal but depending upon that of the analog data/dither signal put out by the adder 12. A feature of this embodiment resides, therefore, in a level discriminating circuit 30b connected between the output of the adder 12 and the control inputs of the dither level control circuit 74. The general organization of this FIG. 6 embodiment is similar to that of the FIG. 5 embodiment except for the connection of the sample and hold circuit 60 between input line 10 and adder 12, and for the substitution of the level discriminating circuit 30b for the level discriminating circuit 30a.

The level discriminating circuit 30b includes the voltage comparator 32 having its inputs connected to the output of the adder 12 and to the reference voltage source 34 as in the FIG. 1 embodiment. The reference voltage Vr is equal to the maximum allowable input voltage Vm of the first A/D converter 36. The output of the voltage comparator 32 is connected both to a shift register 80 and to a normally open switch 82 on a line 84 for the delivery of clock pulses to the shift register. The shift register 80 has 12 output terminals, designated (1) through (12), which are connected respectively to the switches S1 through S12 of the dither level control circuit 74.

Intended for the selective delivery of clock pulses to the shift register 80, the switch 82 is to be closed when the voltage of the data/dither signal put out by the adder 12 exceeds the reference voltage. Vr. The shift register 80 is further provided with a reset signal line 86 in order to be reset at the beginning or end of each operating cycle of the sample and hold circuit 60. We understand that the repetition rate of the clock pulses delivered to the shift register 80 is sufficiently higher than the sampling rate of the sample and hold circuit 60.

Operation of the Fifth Form

Let us first assume that the voltage of the incoming analog data signal is so low that the analog data/dither signal produced by the adder 12 has a voltage less than the reference voltage Vr, which in this case is equal to the maximum allowable input voltage Vm of the first A/D converter 36. Since then the output from the comparator 32 is low, the switch 82 remains open to hold the shift register 80 inoperative. Then the switches S1 through S2 of the dither level control circuit 74 all remain closed for the delivery of the full 12 bits digital dither signal from dither generator 70 to D/A converter 72. The analog dither signal of the full magnitude thus produced by the dither generating circuit 14a is added to the analog data signal as in all the foregoing embodiments.

As the voltage of the incoming analog data signal goes higher, the voltage of the output from the adder 12 may exceeds the predetermined limit Vr or Vm. The resulting high output from the comparator 32 will close the switch 82 for the commencement of the delivery of clock pulses to the shift register 80. Inputting the clock pulses as data and further utilizing them as shift pulses, the shift register 80 will operate in the known manner such that the outputs therefrom will successively go high from the first terminal (1) toward the twelfth terminal (12). The switches S1 through S12 of the dither level control circuit 74 will successively open, in the order of from S1 toward S12, in response to the high outputs from the associated terminals of the shift register 80.

All the switches S1 through S12 will, or will not, open before the voltage of the data/dither signal becomes less than the predetermined limit Vr, depending upon the magnitude of the incoming analog data signal. When the voltage of the data/dither signal decreases below the predetermined limit Vr, the output from the comparator 32 will go low thereby opening the switch 82 and so terminating the delivery of the clock pulses to the shift register 80. Thereupon the shift register 80 will go out of operation and maintain the state in which it was, until it is reset. It will be seen, then, that how many of the switches S1 through S12 will open during each operating cycle of the sample and hold circuit 60 depends upon the magnitude of the incoming analog data signal. The level discriminating circuit 30b coacts with the dither generating circuit 14a to reduce the magnitude of the dither signal to a variable extent necessary for maintaining the magnitude of the data/dither signal within the maximum allowable input level of the first A/D converter 36.

Possible Modifications

Although we have shown and described our invention in terms of some preferable embodiments thereof, we recognize, of course, that our invention could be embodied in other forms within the broad teaching hereof. The following is a brief list of possibvle modifications or alterations of the illustrated embodiments which we believe fall within the scope of our invention:

1. The time division multiplexing of the data/dither signal and dither signal in the FIG. 2 embodiment could be accomplished by various circuit arrangements other than that disclosed herein. For example, the the gate circuit 46 could be connected on the output side, instead of on the input side, of the adder 12 for gating the analog data/dither signal. Further, in this case, a sampling gate might be connected between gate circuit 16 and A/D converter 36 for sampling the analog dither signal. Then the analog data/dither signal and the analog dither signal would be input to the A/D converter 36 by time division multiplexing.

2. The memory 48 of the FIG. 2 embodiment could be used for delaying the data/dither signal into synchronization with the dither signal.

3. The sampling gate circuit 50 of the FIG. 2 embodiment could be connected on the input side, instead of on the output side, of the subtracter 40 for extracting the data/dither signal. The dither signal might then be subtracted from the data/dither signal by the subtracter 40.

4. The teachings of FIGS. 4 and 6 embodiments, wherein the gate circuit 16 or dither level control circuit 74 is controlled in accordance with the magnitude of the data/dither signal put out by the adder 12, could be applied to the FIG. 2 embodiment wherein the data/dither signal and dither signal are time multiplexed for processing by the same A/D converter 36. Thus, as indicated by the dashed line in FIG. 2, the level discriminating circuit 30 could be connected to the output of the adder 12.

5. In the dither generating circuit 14a used in the FIGS. 5 and 6 embodiments, a dither level control circuit 74a could be connected on the output side of the D/A converter 72, as illustrated in FIG. 7, for variably reducing the magnitude of the analog dither signal.

6. A combination of a digital dither generator and D/A converter could be used in place of the analog dither generator 14 of the FIGS. 1, 2 and 4 embodiments.

We claim:

1. In a method of digitizing an analog data signal by generating an analog dither signal of smaller magnitude than the analog data signal, adding the analog dither signal to the analog data signal to provide an analog data/dither signal, converting the analog data/dither signal and the analog dither signal into a digital data/dither signal and a digital dither signal respectively, and subtracting the digital dither signal from the digital data/dither signal to obtain a digital data signal equivalent to the analog data signal, the improvement which comprises ascertaining whether or not the magnitude of the analog data/dither signal will exceed the capacity of an analog to digital converter used for the conversion of at least the data/dither signal, and inhibiting the addition of the analog dither signal to the analog data signal when the magnitude of the analog data/dither signal is ascertained to exceed the capacity of the analog to digital converter.

2. The method of claim 1 wherein whether or not the magnitude of the analog data/dither signal will exceed the capacity of the analog to digital converter is ascertained by comparing the magnitude of the incoming analog data signal with a reference magnitude predetermined in relation to the capacity of the analog to digital converter.

3. In a method of digitizing an analog data signal by adding an analog dither signal to the analog data signal to provide an analog data/dither signal, converting the analog data/dither signal and the analog dither signal into a digital data/dither signal and a digital dither signal respectively, and subtracting the digital dither signal from the digital data/dither signal to obtain a digital data signal equivalent to the analog data signal, the improvement which comprises comparing the magnitude of the analog data/dither signal with a reference magnitude predetermined in relation to the capacity of an analog to digital converter used for the conversion of at least the data/dither signal, and inhibiting the addition of the analog dither signal to the analog data signal when the magnitude of the analog data/dither signal exceeds the reference magnitude.

4. In a method of digitizing an analog data signal by generating an analog dither signal of smaller magnitude than the analog data signal, adding the analog dither signal to the analog data signal to provide an analog data/dither signal, converting the analog data/dither signal and the analog dither signal into a digital data/dither signal and a digital dither signal respectively, and subtracting the digital dither signal from the digital data/dither signal to obtain a digital data signal equivalent to the analog data signal, the improvement which comprises ascertaining whether or not the magnitude of the analog data/dither signal will exceed the capacity of an analog to digital converter used for the conversion of at least the data/dither signal, and, when the magnitude of the analog data/dither signal is ascertained to exceed the capacity of the analog to digital converter, reducing the magnitude of the analog dither signal to an extent necessary to hold the magnitude of the analog data/dither signal within the capacity of the analog to digital converter, wherein whether or not the magnitude of the analog data/dither signal will exceed the capacity of the analog to digital converter is ascertained by comparing the magnitude of the incoming analog data signal with a reference magnitude predetermined in relation to the capacity of the analog to digital converter.

5. In a method of digitizing an analog data signal by adding an analog dither signal to the analog data signal to provide an analog data/dither signal, converting the analog data/dither signal and the analog dither signal into a digital data/dither signal and a digital dither signal respectively, and subtracting the digital dither signal from the digital data/dither signal to obtain a digital data signal equivalent to the analog data signal, the improvement which comprises comparing the magnitude of the analog data/dither signal with a reference magnitude predetermined in relation to the capacity of an analog to digital converter used for the conversion of at least the data/dither signal, and, when the magnitude of the analog data/dither signal exceeds the reference magnitude, reducing the magnitude of the analog dither signal to an extent necessary to hold the magnitude of the analog data/dither signal within the capacity of the analog to digital converter.

6. A system for digitizing an analog data signal, comprising:
(a) input means for receiving the analog data signal;
(b) a dither generator for generating an analog dither signal of smaller magnitude than the analog data signal;
(c) a level discriminating circuit connected to the input means for discriminating whether the magnitude of the incoming analog data signal exceeds a predetermined limit or not;

(d) a gate circuit connected both to the dither generator and to the level discriminating circuit for permitting the passage therethrough of the analog dither signal when the magnitude of the incoming digital data signal does not exceed the predetermined limit, and for inhibiting the passage of the analog dither signal when the magnitude of the incoming digital data signal exceeds the predetermined limit;

(e) an adder connected both to the input means and to the gate circuit for adding the analog data signal and the analog dither signal to provide an analog data/dither signal;

(f) analog to digital converter means for converting the analog data/dither signal and the analog dither signal into a digital data/dither signal and a digital dither signal, respectively; and (g) a subtracter for subtracting the digital dither signal from the digital data/dither signal to provide a digital data signal equivalent to the analog data signal.

7. A system for digitizing an analog data signal, comprising:

(a) input means for receiving the analog data signal;

(b) a dither generator for generating an analog dither signal of smaller magnitude than the analog data signal;

(c) a level discriminating circuit connected to the input means for discriminating whether the magnitude of the incoming analog data signal exceeds a predetermined limit or not;

(d) a gate circuit connected both to the dither generator and to the level discriminating circuit for permitting the passage therethrough of the analog dither signal when the magnitude of the incoming analog data signal does not exceed the predetermined limit, and for inhibiting the passage of the analog dither signal when the magnitude of the incoming analog data signal exceeds the predetermined limit;

(e) an adder connected both to the input means and to the gate circuit for adding the analog data signal and the analog dither signal to provide an analog data/dither signal;

(f) a first analog to digital converter connected to the adder for converting the data/dither signal from analog to digital form;

(g) a second analog to digital converter connected to the gate circuit for converting the dither signal from analog to digital form; and (h) a subtracter connected to both the first and second analog to digital converters for subtracting the digital dither signal from the digital data/dither signal to provide a digital data signal equivalent to the analog data signal.

8. The system of claim 7 wherein the predetermined limit is not more than the difference between the maximum allowable input magnitude of the first analog to digital converter and the magnitude of the analog dither signal.

9. A system for digitizing an analog data signal, comprising:

(a) input means for receiving the analog data signal;

(b) a dither generator for generating a digital dither signal of smaller magnitude than the analog data signal;

(c) a level discriminating circuit connected to the input means for discriminating whether the magnitude of the incoming analog data signal exceeds a predetermined limit or not;

(d) a gate circuit connected both to the dither generator and to the level discriminating circuit for permitting the passage therethrough of the analog dither signal when the magnitude of the incoming analog data signal does not exceed the predetermined limit, and for inhibiting the passage of the analog dither signal when the magnitude of the incoming analog data signal exceeds the predetermined limit;

(e) time division multiplexing means connected both to the input means and to the gate circuit for time division multiplexing the analog dither signal and an analog data/dither signal, the latter being an addition of the analog data signal and the analog dither signal;

(f) an analog to digital converter connected to the time division multiplexing means for converting the multiplexed dither signal and data/dither signal from analog to digital form to provide an output comprised of a digital dither signal and a digital data/dither signal; and (g) dither removing circuit means connected to the analog to digital converter for removing the digital dither signal from the digital data/dither signal to provide a digital data signal equivalent to the analog data signal.

10. A system for digitizing an analog data signal, comprising:

(a) input means for receiving the analog data signal;

(b) a dither generator for generating an analog dither signal;

(c) a gate circuit connected to the dither generator for permitting the selective passage therethrough of the analog dither signal;

(d) an adder connected both to the input means and to the gate circuit for adding the analog dither signal to the analog data signal to provide an analog data/dither signal;

(e) a level discriminating circuit connected between the adder and the gate circuit for causing the gate circuit to inhibit the passage of the analog dither signal when the magnitude of the analog data/dither signal exceeds a predetermined limit;

(f) a first analog to digital converter connected to the adder for converting the data/dither signal from analog to digital form;

(g) a second analog to digital converter connected to the gate circuit for converting the dither signal from analog to digital form; and (h) a subtracter connected to both the first and second analog to digital converters for subtracting the digital dither signal from the digital data/dither signal to provide a digital data signal equivalent to the analog data signal.

11. The system of claim 10 wherein the predetermined limit is not more than the maximum allowable input magnitude of the first analog to digital converter.

12. A system for digitizing an analog data signal, comprising:

(a) input means for receiving the analog data signal;

(b) a dither generator for generating an analog dither signal;

(c) a gate circuit connected to the dither generator for permitting the selective passage of the analog dither signal therethrough;

(d) time division multiplexing means connected both to the input means and to the gate circuit for time division multiplexing the analog dither signal and and an analog data/dither signal, the time division multiplexing means including an adder for adding the analog data signal and the analog dither signal to provide the analog data/dither signal;

(e) a level discriminating circuit connected between the the adder and the gate circuit for causing the gate circuit to inhibit the passage of the analog dither signal when the magnitude of the analog data/dither signal exceeds a predetermined limit;

(f) an analog to digital converter connected to the time division multiplexing means for converting the multiplexed dither signal and data/dither signal from analog to digital form to provide an output comprised of a digital dither signal and a digital data/dither signal; and (g) dither removing circuit means connected to the analog to digital converter for removing the digital dither signal from the digital data/dither signal to provide a digital data signal equivalent to the analog data signal.

13. A system for digitizing an analog data signal, comprising:

(a) input means for receiving the analog data signal;

(b) a dither generating circuit for generating an analog dither signal, the dither generating circuit being capable of controllably varying the magnitude of the analog dither signal;

(c) a level discriminating circuit connected to the input means for discriminating the magnitude of the incoming analog data signal to ascertain whether or not the total magnitude of an addition of the analog data signal and the analog dither signal will exceed a predetermined limit, the level discriminating circuit being further connected to the dither generating circuit for causing the same, when the total magnitude of the analog data signal and the analog dither signal has been ascertained to exceed the predetermined limit, to reduce the magnitude of the analog dither signal to an extent necessary to make the total magnitude of the analog data signal and the analog dither signal fall within the predetermined limit;

(d) an adder connected both to the input means and to the dither generating circuit for adding the analog data signal and the analog dither signal to provide an analog data/dither signal;

(e) analog to digital converter means for converting the data/dither signal and the dither signal of the controlled magnitude from analog to digital form to provide a digital data/dither signal and a digital dither signal; and (f) dither removing circuit means connected to the analog to digital converter means for removing the digital dither signal from the digital data/dither signal to provide a digital data signal equivalent to the analog data signal.

14. The system of claim 13 wherein the analog to digital converter means comprises a first analog to digital converter connected to the adder for digitizing the analog data/dither signal, and a second analog to digital converter connected to the dither generating circuit for digitizing the analog dither signal, and wherein the predetermined limit is the maximum allowable input magnitude of the first analog to digital converter.

15. The system of claim 13 wherein the dither generating circuit comprises:

(a) a generator for generating a digital dither signal;

(b) a dither level control circuit for controllably varying the magnitude of the digital dither signal; and (c) a digital to analog converter for converting the dither signal of controlled magnitude from digital to analog form.

16. The system of claim 13 wherein the dither generating circuit comprises:

(a) a generator for generating a digital dither signal;

(b) a digital to analog converter for converting the dither signal from digital to analog form; and (c) a dither level control circuit for controllably varying the magnitude of the analog dither signal.

17. A system for digitizing an analog data signal, comprising:

(a) input means for receiving the analog data signal;

(b) a dither generating circuit for generating an analog dither signal, the dither generating circuit being capable of controllably varying the magnitude of the analog dither signal;

(c) an adder connected both to the input means and to the dither generating circuit for adding the analog data signal and the analog dither signal to provide an analog data/dither signal;

(d) a level discriminating circuit connected to the output of the adder for comparing the magnitude of the analog data/dither signal with a predetermined limit, the level discriminating circuit being further connected to the dither generating circuit for causing the same, when the magnitude of the analog data/dither signal exceeds the predetermined limit, to reduce the magnitude of the analog dither signal to an extent necessary to make the magnitude of the analog data/dither signal fall within the predetermined limit;

(e) analog to digital converter means for converting the data/dither signal and the dither signal of the controlled magnitude from analog to digital form to provide a digital data/dither signal and a digital dither signal; and (f) dither removing circuit means connected to the analog to digital converter means for removing the digital dither signal from the digital data/dither signal to provide a digital data signal equivalent to the analog data signal.

18. The system of claim 17 wherein the analog to digital converter means comprises a first analog to digital converter connected to the adder for digitizing the analog data/dither signal, and a second analog to digital converter connected to the dither generating circuit for digitizing the analog dither signal, and wherein the predetermined limit is the maximum allowable input magnitude of the first analog to digital converter.

19. The system of claim 17 wherein the dither generating circuit comprises:

(a) a generator for generating a digital dither signal;

(b) a dither level control circuit for controllably varying the magnitude of the digital dither signal; and (c) a digital to analog converter for converting the dither signal of controlled magnitude from digital to analog form.

20. The system of claim 17 wherein the dither generating circuit comprises:

(a) a generator for generating a digital dither signal;

(b) a digital to analog converter for converting the dither signal from digital to analog form; and (c) a dither level control circuit for controllably varying the magnitude of the analog dither signal.

* * * * *